(12) United States Patent
Redpath et al.

(10) Patent No.: US 9,660,410 B2
(45) Date of Patent: May 23, 2017

(54) LASER LIGHTING DEVICE AND APPLICATION THEREOF

(71) Applicant: Parhelion Incorporated, Wilmington, DE (US)

(72) Inventors: Richard Redpath, Cary, NC (US); James Redpath, Cary, NC (US)

(73) Assignee: PARHELION INCORPORATED, Wilmington, DE (US)

( * ) Notice: Subject to any disclaimer, the term of this patent is extended or adjusted under 35 U.S.C. 154(b) by 265 days.

(21) Appl. No.: 14/564,854

(22) Filed: Dec. 9, 2014

(65) Prior Publication Data
US 2016/0164245 A1    Jun. 9, 2016

(51) Int. Cl.
| | |
|---|---|
| *H01S 3/1055* | (2006.01) |
| *H01S 5/00* | (2006.01) |
| *G02B 27/09* | (2006.01) |
| *G02B 27/10* | (2006.01) |
| *G02B 27/20* | (2006.01) |
| *G02B 27/42* | (2006.01) |
| *G08B 7/06* | (2006.01) |

(52) U.S. Cl.
CPC ........ *H01S 3/1055* (2013.01); *G02B 27/0944* (2013.01); *G02B 27/1093* (2013.01); *G02B 27/20* (2013.01); *G02B 27/425* (2013.01); *G08B 7/066* (2013.01); *H01S 5/0071* (2013.01)

(58) Field of Classification Search
CPC .. G02B 27/20; G02B 27/425; G02B 27/0944; G02B 27/1093; G08B 7/066; H01S 3/1055; H01S 5/0071
See application file for complete search history.

(56) References Cited

U.S. PATENT DOCUMENTS

| | | | |
|---|---|---|---|
| 8,360,612 B2 * | 1/2013 | Redpath | F21V 33/0076 348/774 |
| 2002/0061048 A1 | 5/2002 | Schmidt | |
| 2011/0075259 A1 | 3/2011 | Shpunt | |
| 2011/0280006 A1 | 11/2011 | Redpath | |
| 2012/0105855 A1 | 5/2012 | Miyasaka | |
| 2012/0326635 A1 * | 12/2012 | Redpath | G02B 5/1842 315/362 |
| 2013/0120841 A1 | 5/2013 | Shpunt | |

* cited by examiner

*Primary Examiner* — Stephen F Husar
(74) *Attorney, Agent, or Firm* — Ming Chow; Sinorica, LLC

(57) ABSTRACT

A laser lighting device provides a broad range illumination for an area, such as a smoke filled space, a hallway or an underwater environment with certain turbidity. This lighting device contains a laser diode as a light source and a diffraction grating that is able to diffract an input laser light beam generated from the laser diode into a plurality of output laser light beams with the cross section of the plurality of output laser light beams forming a pattern comprising a plurality of light spots. In addition, this pattern may be in a donut shape. That is to say, the power of a light spot formed by a zero order light beam is lower than other light spots' power. Further, this laser lighting device is used to provide lighting with depth perception and forward visibility.

12 Claims, 12 Drawing Sheets

2 Person Hallway 150 cm
Single family dwelling 100 cm

Center axis { 0.03, 0.05, 0.08, 0.15, 0.5, 0.15, 0.08, 0.05, 0.03 }

Center axis { 0.008, 0.16, 0.17, 0.09, 2.50, 0.09, 0.17, 0.16, 0.0008 }

LASER LIGHTING DEVICE AND APPLICATION THEREOF

FIELD OF THE INVENTION

The present invention relates generally to a lighting device and the application thereof. More specifically, it is a laser lighting device that is able to provide a plurality of light beams in certain situations such as a smoke filled space, turbidity and the like.

BACKGROUND OF THE INVENTION

Lighting is a fundamental element for allowing a human to gain a sight. Such lighting comprises a wide variety of different light sources, including sunlight, fire, different types of traditional incandescent light, the more energy conservative CFL light, LED light, as well as the more efficient laser light and etc.

Each of the foregoing light sources has its specific application areas. For example, sun light is typically enough for outdoor activities in day time; while it is not very useful in a closed area. These artificial (human made) light sources are usually used indoors. They are able to provide lighting in different situations and at different locations. However, in certain specific areas, including the lighting for a long yet narrow hallway and a smoke filled area, most of the conventional light sources are not able to provide lighting with desirable depth perception and forward visibility. On the other hand, in those specific areas including the long narrow hallway and the smoke filled area, such features including depth perception and forward visibility are even more important and necessary. For example, in a smoke filled area at a fire scene, a good lighting is able to save many lives.

In view of the foregoing, a specific lighting device which is capable of functioning properly in areas like a long narrow hallway or a smoke filled area in urgent needs, in order to provide desirable depth perception and forward visibility.

Up to date, most of the existing technologies or available lighting devices, which are purported to function in the foregoing areas, are not capable of providing satisfactory results. Some devices can only provide poor lighting results in these situations. While other devices are capable of providing relatively better lighting results, yet they typically require complex structure or infrastructures, such as certain wiring work, which are actually what people try to avoid when walking in a long narrow hallway or escaping from a smoke filled fire scene.

As mentioned above, the existing technology may need complex design and/or supporting wiring or other components in order to provide desirable lighting to certain areas such as long narrow hallway, small room and so on. It is common for an infrastructure of wiring and/or fiber optics to be utilized in order to achieve lighting along stepped areas or simply to have a wide reflective base light such as a plug in night light for radial illumination or side wall mounted units. Some laser light fire evacuation systems need complex infrastructures in which beams of laser light are wired into the ceiling using fiber optics and embedded laser diodes controlled by a central unit with possible mechanical apparatus such as a rotating mirror. In some other existing technologies, fiber optics is used as wall mounted units or light strips along the path of a hallway for area illumination.

The above mentioned existing devices are apparently not very efficient and not easy to use. In this respect, the laser lighting device and application thereof in the present invention are able to provide a better lighting, especially in such areas, including a long narrow hallway, a smoke filled room or an underwater environment with certain turbidity. This device departs from the conventional design of the modern day lighting system and provides desirable depth perception and forward visibility. In addition, such narrow area lighting utility is enabled without the need for more complex lighting connection infrastructure.

Laser light has already been used in fire escape system to overcome the less visibility of lights when the smoke becomes thick. Additionally its light beams are serially staged to turn on as to lead for escape. Unfortunately, the laser light is not used to project dots of light refracting (bending) on the surfaces to identify planes radiating along the way to guide an individual toward the exit in providing depth perception and forward visibility. In addition, the currently available laser lighting devices do not function well in a smoke filled room. If the laser light is very bright, then the smoke (tiny particles forming the smoke) or turbidity will reflect a strong light backward, which would present the user to see any details other than a blinding sight field. On the other hand, if the laser light is not that bright, then the smoke (small particles) may absorb a substantially part of the light, which may render the detectable forward distance too short to be useful.

In light of the foregoing, it therefore an objective of the present invention to provide a laser lighting device, which is able to offer a desirable depth perspective and forward vision; and at the same time, avoid the situations that a laser light is reflected by smoke particles thus to form a blinding sight field without discernible details and that a laser light is absorbed by the smoke particles and thus lost in a short distance before traveling enough distance in a smoke.

DETAIL DESCRIPTIONS OF THE INVENTION

All illustrations of the drawings are for the purpose of describing selected versions of the present invention and are not intended to limit the scope of the present invention.

The present invention is a laser lighting device which is suitable to be used in certain situations, including a long hallway, a smoke filled room or other close space, as well as an underwater environment with certain turbidity. In addition, with limited infrastructure setup, it is able to achieve a desirable area illumination.

Further, the present invention also includes a method for using the foregoing laser lighting device, so as to provide a desirable lighting effect in certain areas or situations.

More specifically, the present invention has provided a laser lighting device which is able to emit a plurality of light beams that cover a broad area instead of the common radial light used in modern lighting, which is typically a single light beam to provide a single bright spot, which is more concentrated.

In particular, with respect to the beams of laser light disclosed in the present invention, the light intensities (power) of the plurality of light beams can be uniform or not uniform (in a pattern, such as donut pattern). In one case, its light dots in central area are much weaker than the light dots in out edge areas. In this way, the light dots generated by the laser lighting device of the present invention are thus in a unique donut pattern, which is particular useful in certain situations, such as a smoke filled room.

In addition, the laser lighting device of the present invention can also be used under water, such as in a pool. When being used as pool lighting, it is able to provide a compelling light feature for underwater illumination. The pool areas will be illuminated with dots to outline the pool bounds clearly and water areas with distorted dots. In addition, the present invention can also be used in deep sea as submersible lighting, including LED/strobe light.

Figure 1A:
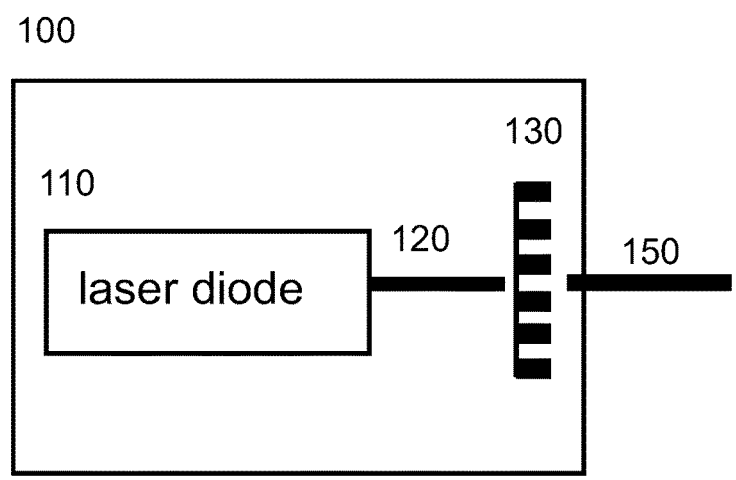
FIG. 1A is a schematic view of one embodiment of the present invention.

In reference to FIG. 1A, the laser lighting device 100 of the present invention primarily comprises a laser diode 110 and a diffraction optical grating 130. Moreover, the present invention may comprise an enclosure to cover the laser diode and the diffraction grating.

It is noted that any laser diode that can properly function in the lighting device of the present invention can be used in the present invention. In other words, the present invention does not need a specific type of laser diode. A laser diode is an electrically pumped semiconductor laser in which the active medium is formed by a p-n junction of a semiconductor diode similar to that found in a light emitting diode. The laser diode is the most common type of laser produced with a wide range of application. In the present invention, the laser diode has been used as a reliable light source.

A laser diode is electrically a p-i-n diode. The active region of the laser diode is in the intrinsic region, and the carriers, electrons and holes, are pumped into it from the N and P regions respectively. All modern lasers use the double hetero-structure implementation, where the carriers and the photons are confined in order to maximize their chances for recombination and light generation. Unlike a regular diode used in electronics, the goal for a laser diode is that all carriers recombine in the intrinsic region, and thus produce light.

The diffraction grating 130 is another key component of the present invention. A diffraction grating is an optical component with a periodic structure, which splits and diffracts light into several beams travelling in different directions. The directions of these beams depend on the spacing of the grating and the wavelength of the light so that the grating acts as the dispersive element. For practical applications, gratings generally have ridges or rulings on their surface rather than dark lines.

As for the function of a diffraction grating, the relationship between the grating spacing and the angles of the incident and diffracted beams of light is known as the grating equation. According to the Huygens-Fresnel principle, each point on the wave front of a propagating wave can be considered to act as a point source, and the wave front at any subsequent point can be found by adding together the contributions from each of these individual point sources.

Moreover, a grating may be of the 'reflective' or 'transmissive' type, analogous to a mirror or lens respectively. In the present invention, the diffraction grating is primarily a transmissive type grating.

In the present invention, a beam of laser light 120 has been generated from the laser diode. The light beam is incident with the diffraction grating; and under the effect of the grating, it becomes a combination of a plurality of laser light beams 150, wherein the single light beam may be referred to as the input laser light beam and the plurality of laser light beams coming out from the diffraction grating may be referred to as the output laser light beam.

Figure 1B:
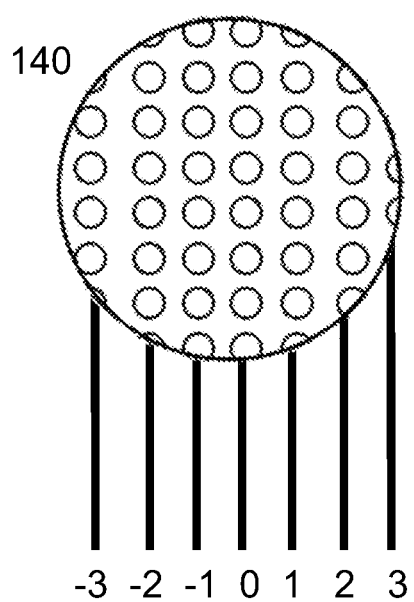
FIG. 1B is a schematic view of a cross section of the laser light beams (150) shown in FIG. 1A.

Further, as shown in FIG. 1B, in the cross section 140 of the output laser light beam, the plurality of laser light beams has been distributed to form a specific pattern. In certain specific situations, such as a long hallway, a smoke filled room or an underwater environment with certain turbidity, in order to provide a clear vision with perception and forward visibility, the plurality of output light beams needs to be in a certain pattern (such as the donut pattern).

As mentioned previously, the diffraction grating is able to convert a single laser light beam into a plurality of laser beams. This process results in a non-blinding lighting effect. The coherence of the laser beams limits the ability for blinding light. A blinding light makes a space light glow enough that a person cannot discern anything other than the glowing space. The plurality of beams is defined by the term M Orders. The diffraction grating is designed to produce closely equal power for the M orders. Typically we could achieve as many as 10 orders which are about 400 laser beams. M is an integer known as the order of the diffracted beam. By the physical law, $m\lambda = d \sin \theta$, wherein, $\lambda$ is the wavelength, d is the distance between crystal planes, $\theta$ is the angle of the diffracted wave and m is an integer known as the order of the diffracted beam. In other words, at a distance d, a displacement y of each beam from a central line of the diffraction grating is equal to an order m of the beam times a wavelength $\lambda$ of the laser light times the distance D divided by a slit separation d of the diffraction grating.

Figure 2:
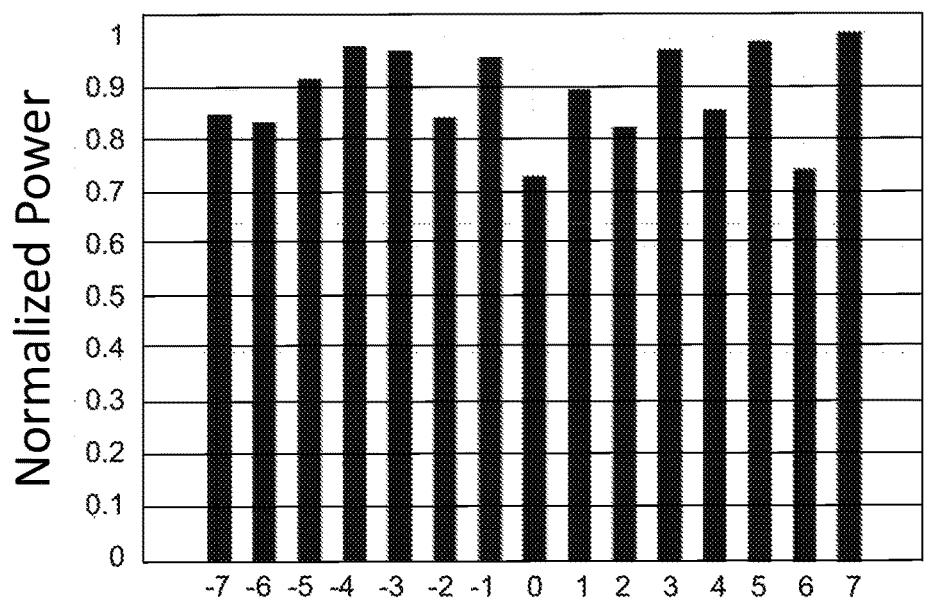
FIG. 2 is a normalized power distribution of the light beams of one embodiment of the present invention.

In reference to FIG. 2, a sophisticated semiconductor edging techniques has been used to produce seven m orders of light beams. The power of each beam has been assessed. It has demonstrated that the power of each beam is pretty close to each other. In addition, the power differences among each beam are randomly distributed with little difference among different beams.

Figure 4:
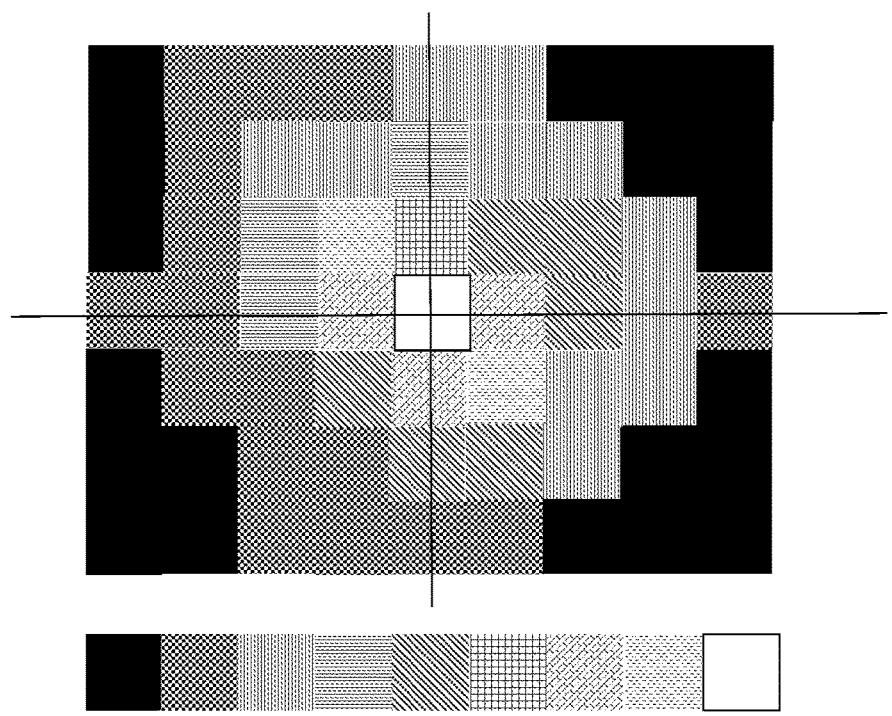
FIG. 4 is an assessment of the light beams diffracted from a green (532 nm) laser light source.

In one exemplary embodiment of the present invention, the laser diode source is a 532 nm green laser with a power of 20 mw as shown in FIG. 4. The white area is just under 1 mw output measured at 100 mm through an 8 mm sensor. Four orders are shown to the left and right and the zero order in the center (being white). The darker the green the less power it is; and the brighter (white), the higher is the output powder. In this embodiment, we could see that the energy distribution is in a diagonal pattern. In addition, it may also be seen that the distribution is not normalized across the orders, as more power outside the first order.

Figure 5:
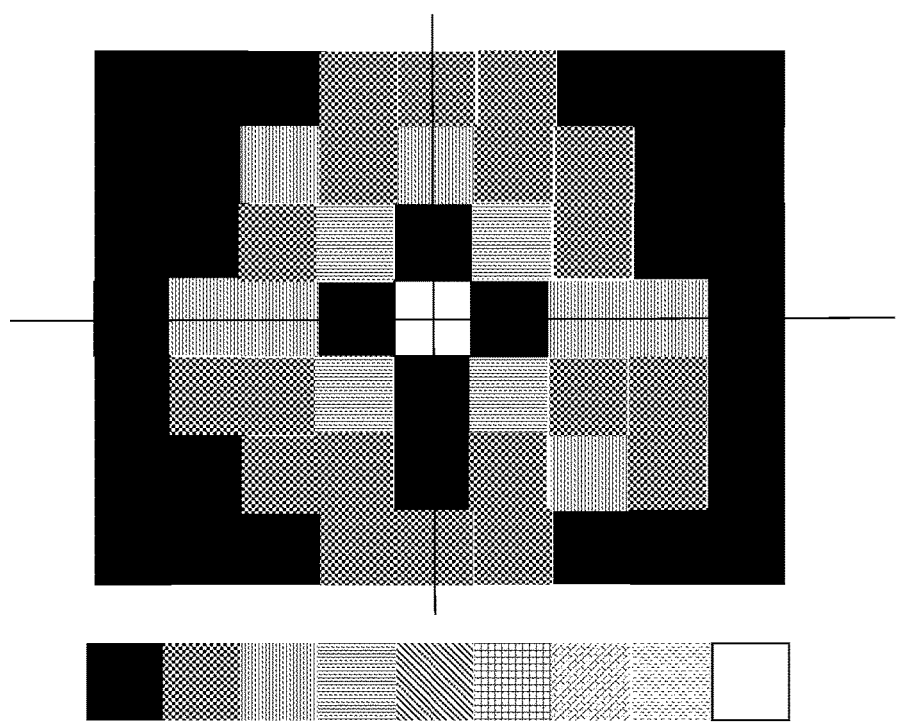
FIG. 5 is an assessment of the light beams diffracted from a blue (450 nm) laser light source.
Figure 6A:
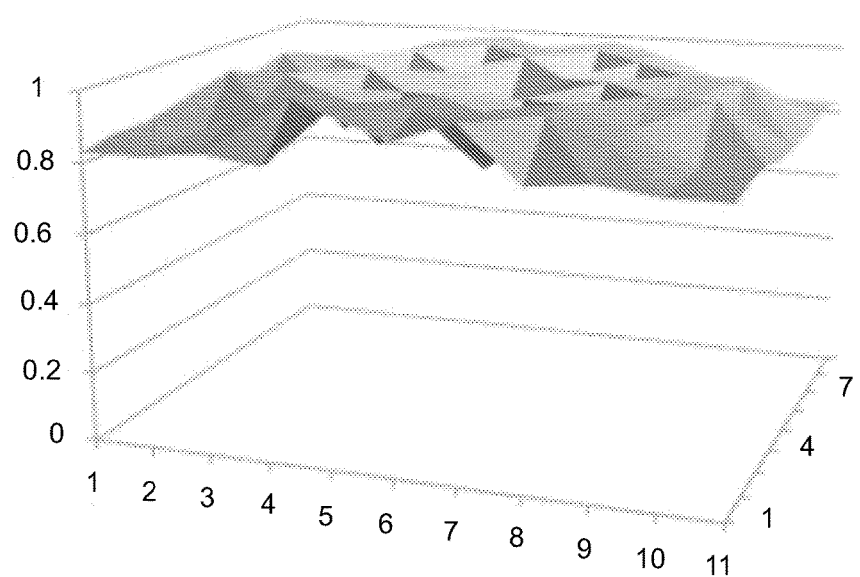
FIGS. 6A to 6D are analysis of the donut light beam distribution.
Figure 6B:
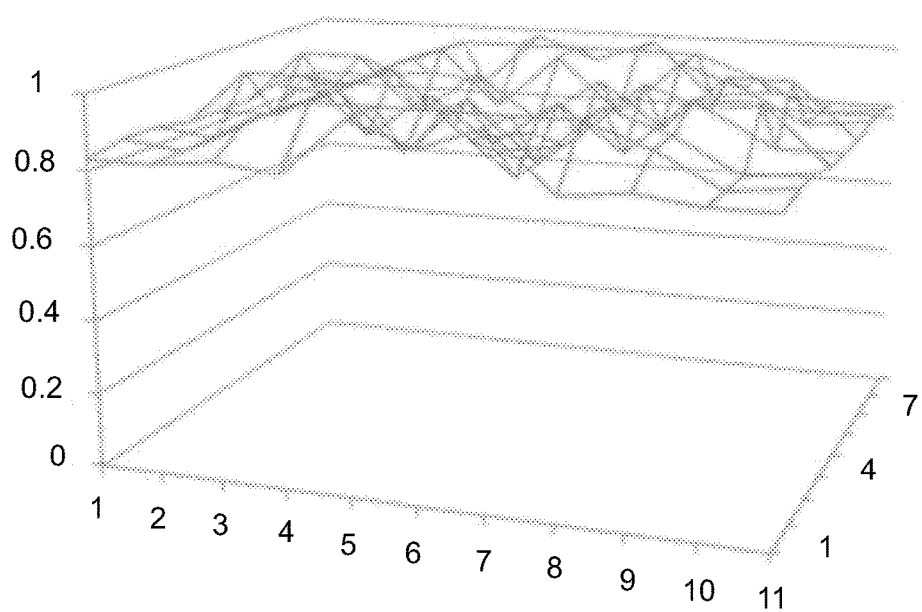
Figure 6C:
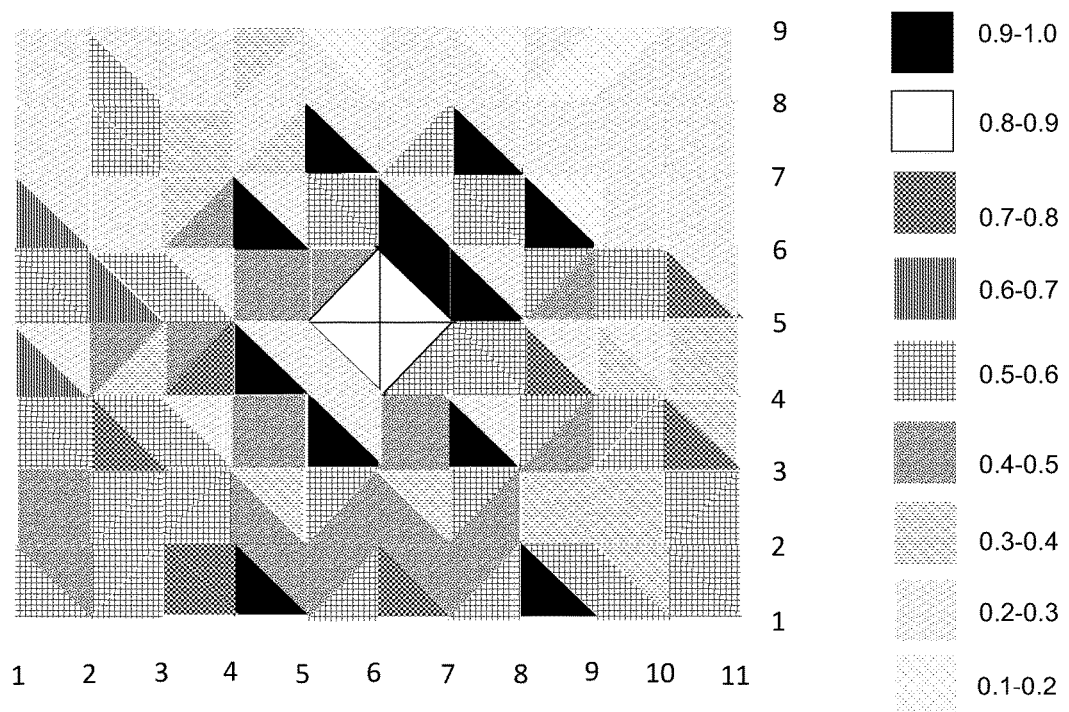
Figure 6D:
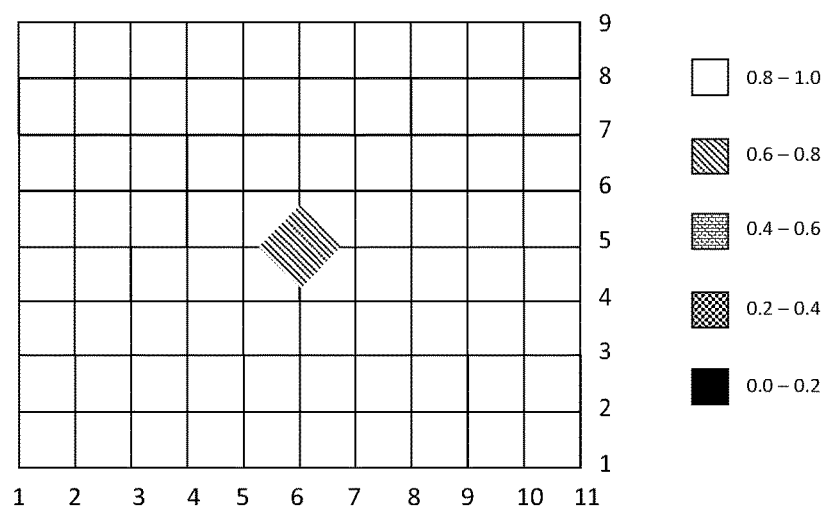

In another exemplary embodiment, as shown in FIG. 5, the laser source is at 450 nm with an input powder of 20 mw. In the central area, the white region is an output of 2.50 mw.

It is desired to distribute the energy more evenly as to use the power of the laser across a wide area but no area is greater than 1 mw. In this regard, if the orders could control a laser power of 10 mw across 5 orders (total 10 on both sides) for an area, then each dot would be 1 mw. In this way, the laser device of such power would be labeled as Class 2, rather than Class 3R. Class 2 laser devices are safe for operation and importation in most countries. While Class 3R laser devices are considered safe only under the condition of handled carefully and with restricted beam viewing, and thus are not safe for legal import and operation.

In light of the foregoing, the laser lighting devices in these exemplary embodiments have the characteristics as follows. The distribution of energy is not gaussian but normalized as to effectively use the laser power across a wide area. In addition, the area between the dots which are referred to as cloud area must be as clear as possible; the point is to create a perfect dot pattern like Young's experiment for light diffraction from a slit. The dots will light an area from outside-in called destination lighting, whereby the observer would not see the light at the source location, and the destination area is lit with more brightness than the source location. Moreover, the dot does not have to be round or square.

On the other hand, in certain situations, such as a smoke filled space, a long hallway or an underwater condition with certain turbidity, the plurality of laser beam with the same intensity may still not be able to offer a desirable lighting effect. In particular in the central vision area, the laser beams may be too bright too yield clear details of the space. In this regard, in the present invention, the diffraction grating has been further modified to reduce the power of the central laser beams thereby not using the center space for lighting. As a result, a clearer center space in a smoke filled room will seem to light the walls and floor more efficiently in an environment that blinding light is an issue.

Figure 3:
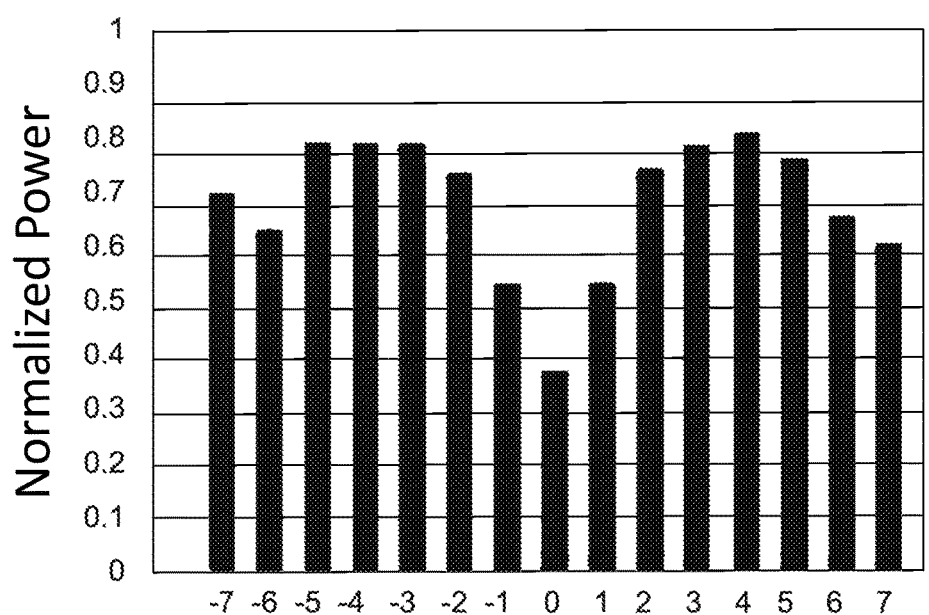
FIG. 3 is a normalized power distribution of the light beams of another embodiment (donut pattern) of the present invention.

In reference to FIG. 3, a chart is shown of a hybrid diffraction grating. The center M orders are less power than the outer edge M orders. This can be referred to as a donut distribution. This specialized Diffraction grating works by controlling the power of the M Orders, which would be optimized for specific room configurations. For example, optimize the M orders for power, especially the donut configuration.

As shown in FIG. 3, in such donut configuration, the output laser light beam at the center (zero order) is less powerful than those light beams in the out area. Alternatively, in some cases, there could be even no zero order light beam at all. The features of this donut distribution have been shown in the FIGS. 6A-6D, where it could be clearly seen that the central area has less power, and it is almost an inverse Gaussian distribution. This donut distribution has a clear advantage in certain situation, such as to provide lighting in a smoke filled room. In such case, the zero order is not needed.

Figure 7:
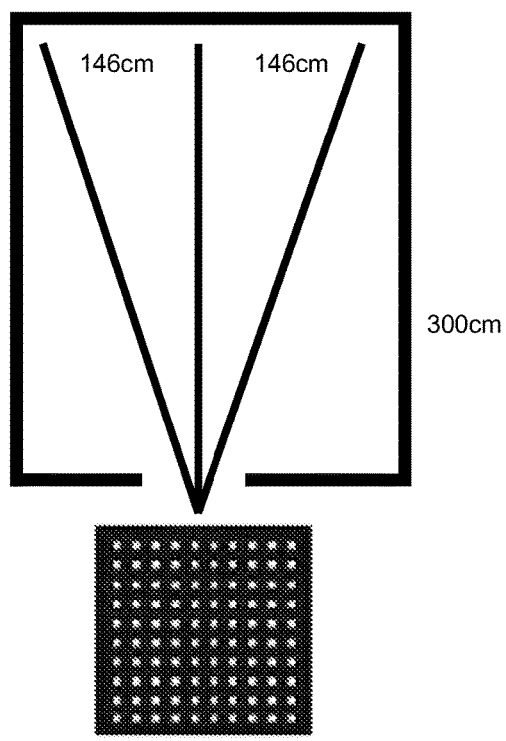
FIG. 7 depicts an example of the present invention used in a small room.

Moreover, it is desired that no more than one dot is within a distance of 0.90 mm from each other at a 100 mm distance so as to not occupy the 8 mm sensor for power measure. In one example, as shown in FIG. 7, assuming at a 300 cm distance (angle of 26.5 degree at each side, full axis is 53 degree total), the 5th order on each side would be at 146 cm from the zero order, which means an occupying space would be 292 cm at the 300 cm distance. It is noted that the zero order is actually the center, although there is no zero order in this case (donut distribution). This is actually optimal for a ceiling in 3 meter square room lighting.

Figure 8:
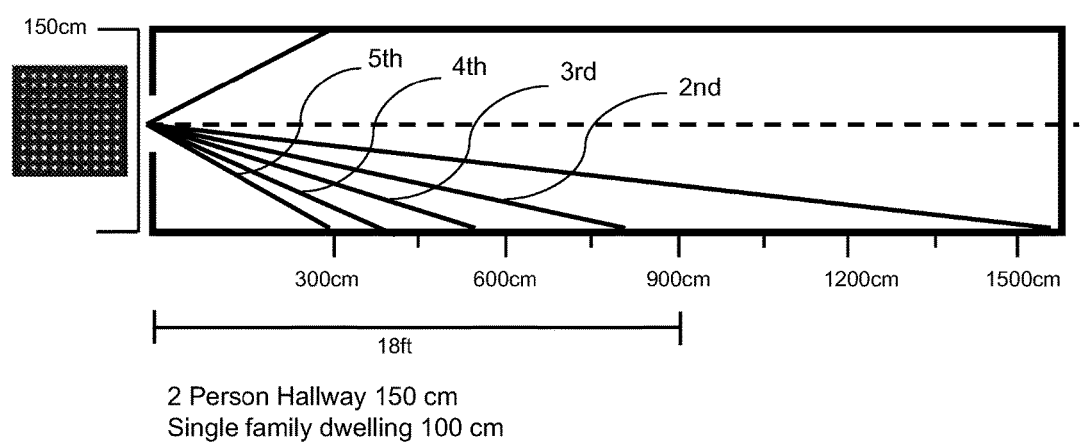
FIG. 8 depicts an example of the present invention used in a long hallway.

In another example, in a two person hallway with a width of 150 cm, assuming the full axis is 53 degree and that each dot is separated by 5.3 (25.6/5=5.3), then the calculated hit positions of the laser lighting on the wall for one set of orders is shown in FIG. 8. For a single family dwelling the hallway would be 100 cm in width. As the purpose is to distribute the power, therefore, if the zero order is less as aforementioned in the donut pattern distribution, the outside light distribution would be stronger. Accordingly, no zero order would be desired.

From the foregoing a few examples, it appears that the present invention also has the features that the light beams at the zero order is much weaker than other light beams and in an extreme condition, it could be essentially removed. Via a number of studies, the full axis area between the 5th orders (left and right sides) has been determined to be 53 degree, which overall is able to yield a desirable result. Further, it has also been optimized that a full axis area between the 5th orders of 50 to 70 degrees for long distance has a tight control of not having more than one beam (dot) within a distance of 7 mm from a 100 mm distance. The human pupil of 7 mm cannot be impacted by more than one beam from a distance of greater than 100 mm for safety concerns.

The central area has been optimized with no laser light beams and thus produces light dots on the walls. That is to say, the floor would be lit as well as the walls, but the central area where most of the smoke existing would have less or essentially no light beam, thus minimize the occurrence of a blinding light. Additionally, without a smoke filled area, more laser power would be safe with the tight safety constraint for the pupil at a distance of 100 mm, which has been previously outlined. The lighting at the out region would be provided with the best possible lighting for a hallway, room, stairs, turbid under water conditions and especially smoke filled space for navigation.

Therefore, the present invention uses a diffraction grating to light small areas for broad illumination with limited lighting infrastructure, wherein the diffraction grating diffracts laser light into a plurality of beams in certain patterns, such as a donut distribution pattern, for producing broad ranged lighting with limited shadows. The illumination creates a three dimensional visual effect including lighting dots and lighting lines and the visual effect.

Although the invention has been explained in relation to its preferred embodiment, it is to be understood that many other possible modifications and variations can be made without departing from the spirit and scope of the invention as herein described.

What is claimed is:

1. A laser lighting device for providing a broad range illumination for an area, the area comprising a smoke filled space, a hallway and an underwater environment with a turbidity, the laser lighting device comprising:
  a laser light source;
  a diffraction element;
  an input laser light beam;
  the input laser light beam being generated by the laser light source;
  a plurality of output laser light beams;
  the plurality of output laser light beams being diffracted from the input laser light beam by the diffraction element;
  a pattern;
  the pattern being formed by a cross section of the plurality of output laser light beams;
  the pattern comprising a plurality of light spots;
  an energy;
  the energy being distributed among the plurality of light spots in a non-gaussian pattern; and
  each light spot of the plurality of light spots being normalized for its power.

2. The laser lighting device for providing a broad range illumination for an area claimed in claim 1 further comprising:
the laser light source being a laser diode; and
the diffraction element being a diffraction optical grating.

3. The laser lighting device for providing a broad range illumination for an area claimed in claim 1 further comprising:
each of the plurality of light spots being a round light spot.

4. The laser lighting device for providing a broad range illumination for an area claimed in claim 1 further comprising:
each of the plurality of light spots being a square light spot.

5. The laser lighting device for providing a broad range illumination for an area claimed in claim 1 further comprising:
a zero order light beam;
a light spot;
the light spot being formed by the zero order light beam in a central area of the pattern; and
in the plurality of light spots, a power of a light spot formed by the zero order light beam being lower than other light spots' power.

6. The laser lighting device for providing a broad range illumination for an area claimed in claim 5 further comprising:
the power of the light spot formed by the zero order light beam being zero.

7. The laser lighting device for providing a broad range illumination for an area claimed in claim 1 further comprising:
a full axis area between a left 5th order light beam and a right 5th order light beam being from 50 degree to 70 degree; and
at a distance of 100 mm from the diffraction element of the laser lighting device, a first light spot being apart from any light spot adjacent to the first light spot in a length of no less than 7 mm.

8. The laser lighting device for providing a broad range illumination for an area claimed in claim 7 further comprising:
the full axis area between a left 5th order light beam and a right 5th order light beam being 53 degree.

9. A method for providing a broad range illumination for an area with a laser lighting device, the area comprising a smoke filled space, a hallway and an underwater environment with a turbidity, the method comprising:
providing a laser light source, the laser light source being a laser diode;
providing a diffraction element, the diffraction element being a diffraction grating;
generating an input laser light beam with the laser light source;
diffracting the input laser light beam into a plurality of output laser light beams with the diffraction element, a cross section of the plurality of output laser light beams forming a pattern comprising a plurality of light spots;
providing a lighting with depth perception and forward visibility for the area;
distributing an energy among the plurality of light spots in a non-gaussian pattern;
making each light spot of the plurality of light spots to be normalized for its power; and
making each of the plurality of light spots to be either a round light spot or a square light spot.

10. The method for providing a broad range illumination for an area with a laser lighting device as claimed in claim 9 further comprising:
forming a light spot in a central area of the pattern with a zero order light beam; and
adjusting a power of a light spot formed by the zero order light beam to be lower than other light spots' power in the plurality of light spots.

11. A method for providing a broad range illumination for an area with a laser lighting device, the area comprising a smoke filled space, a hallway and an underwater environment with a turbidity, the method comprising:
providing a laser light source, the laser light source being a laser diode;
providing a diffraction element, the diffraction element being a diffraction grating;
generating an input laser light beam with the laser light source;
diffracting the input laser light beam into a plurality of output laser light beams with the diffraction element, a cross section of the plurality of output laser light beams forming a pattern comprising a plurality of light spots;
providing a lighting with depth perception and forward visibility for the area;
distributing an energy among the plurality of light spots in a non-gaussian pattern; and
making each light spot of the plurality of light spots to be normalized for its power.

12. The method for providing a broad range illumination for an area with a laser lighting device as claimed in claim 11 further comprising
forming a light spot in a central area of the pattern with a zero order light beam; and
adjusting a power of a light spot formed by the zero order light beam to be lower than other light spots' power in the plurality of light spots.

* * * * *